United States Patent
Baker et al.

(10) Patent No.: US 6,411,367 B1
(45) Date of Patent: Jun. 25, 2002

(54) MODIFIED OPTICS FOR IMAGING OF LENS LIMITED SUBRESOLUTION FEATURES

(75) Inventors: Daniel C. Baker; Subhas Bothra, both of San Jose; Satyendra Sethi, Pleasanton, all of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/280,174

(22) Filed: Mar. 29, 1999

(51) Int. Cl.[7] .................. G03B 27/54; G03B 27/52; G03B 27/32; A61N 5/00; G03L 5/00
(52) U.S. Cl. .................. 355/67; 355/55; 355/71; 355/72; 250/492.2; 250/492.22; 430/30
(58) Field of Search .................. 355/67, 55, 77, 355/71; 250/492.2, 492.22; 430/30

(56) References Cited

U.S. PATENT DOCUMENTS

| | | | | |
|---|---|---|---|---|
| 4,184,763 A | * | 1/1980 | Handsman et al. | ........... 355/27 |
| 4,571,058 A | * | 2/1986 | Lehman | ........... 355/3 |
| 5,636,005 A | * | 6/1997 | Yasuzato | ........... 355/71 |
| 6,268,904 B1 | * | 7/2001 | Mori et al. | |

* cited by examiner

Primary Examiner—Russell Adams
Assistant Examiner—Khaled Brown
(74) Attorney, Agent, or Firm—Wagner, Murabito & Hao LLP

(57) ABSTRACT

A system and method is disclosed for enhancing an optical lithography process by capturing light diffracted from a mask having features to be exposed onto a wafer. In one embodiment, a system of the present invention has in place a mask, a wafer and a reduction lens such that the reduction lens is placed between the mask and the wafer in order to direct and expose the mask's features onto the wafer. Furthermore, a reflective member is disposed proximate to the reduction lens. In order to achieve finer resolution of the mask image on the wafer, this reflective member captures diffracted light diffracting beyond the reduction lens and redirects the diffracted light to pass through the reduction lens such that the diffracted light is redirected onto the wafer. In so doing, the reflective member resolves the mask image on the wafer in more detail than is possible by an optical lithography process using no such reflective member.

20 Claims, 10 Drawing Sheets

Top-Down View Showing the Reflective Member 222

Top-Down View Showing the First Reflective Surface 333a

MODIFIED OPTICS FOR IMAGING OF LENS LIMITED SUBRESOLUTION FEATURES

FIELD OF THE INVENTION

The present invention pertains generally to the field of optical lithographic systems. More specifically, the present invention relates to resolving a mask's image on a semiconductor wafer.

BACKGROUND

In the semiconductor industry, the ongoing quest of integrating more transistors onto a microchip requires transistors to have smaller critical dimensions. Consequently, in order to achieve a smaller critical dimension for these transistors, mask features to be exposed onto a wafer would need to be made smaller as well. However, as light passes through these finer mask features, light containing critical information for resolving the mask image on the wafer diffracts away from the mask in a larger diffraction angle. As this diffraction angle becomes larger due to light passing through finer mask features, the diffracted light travels beyond the reduction lens. Hence, the diffracted light will not be captured by the reduction lens and will not arrive at the wafer. Consequently, the mask feature information contained in the diffracted light is unavailable for resolving the mask image on the wafer. Thus, as the diffraction angle increases due to finer mask features, a need exists for retaining the information lost through the diffracted light in order to utilize the information contained in the diffracted light for resolving the mask feature image on the wafer.

In one prior art attempt to resolve finer mask feature image on the wafer by retaining the information contained in the diffracted light, an enlarged lens is manufactured to capture the diffracted light traveling beyond the reduction lens. However, the size of the reduction lens cannot be increased indefinitely. In fact, as is well known in the art, as lithography technology progresses into the sub-micron level, the size of the reduction lens is approaching its maximum limit.

In another prior art attempt to solve the problem of losing the information contained in the diffracted light, the mask itself is altered to produce a phase shifted mask, wherein contrast of the aerial image generated from the phase shifted mask is increased. In doing so, the phase shifted mask decreases light diffraction from the mask, thereby decreasing the amount of the diffracted light traveling beyond the reduction lens. Consequently, information which would have been lost in the diffracted light becomes available for resolving finer mask features on the wafer. However, a drawback of the phase shifted mask is the resulting extremely high manufacturing cost. Therefore, accommodating smaller mask features and designs by manufacturing shifted masks is not cost effective.

In yet another prior art attempt to retain the information lost through light diffraction, off-axis illumination technique is used to reduce the light diffracting beyond the reduction lens. This technique requires tilting the light source at various angles to illuminate the mask. However, this technique requires complicated and precise positioning of the light source. This precise positioning greatly reduces the margin for errors in the lithographic process.

Thus, a need exists for a system and method for enhancing an optical lithography process where the system and method does not require the use of an enlarged lens in capturing the diffracted light traveling beyond the reduction lens in order to retain information necessary for resolving the mask image on the wafer. A further need exists for a system and method for enhancing an optical lithography process where the system and method does not require the use of a phase shifted mask in reducing light diffraction in order to retain information necessary for resolving the mask image on the wafer. Still a further need exists for a system and method for enhancing an optical lithography process where the system and method does not require the use of off-axis illumination technique in reducing the diffracted light traveling beyond the reduction lens in order to retain information necessary for resolving the mask image on the wafer.

SUMMARY OF THE INVENTION

The present invention is a system and method for enhancing an optical lithography process by capturing light diffracted from a mask having features to be exposed onto a wafer. The present invention advantageously avoids the use of a physically unfeasible enlarged lens to capture diffracted light from the mask. Also, the present invention advantageously avoids the use of a very expensive phase shifted mask to reduce the information loss through the diffracted light. Furthermore, the present invention advantageously avoids the use of complicated off axis illumination technique in reducing the diffracted light traveling beyond the reduction lens.

Specifically, in one embodiment, a system of the present invention has in place a mask, a wafer and a reduction lens such that the reduction lens is placed between the mask and the wafer in order to direct and expose the mask's features onto the wafer. Furthermore, a reflective member is disposed proximate to the reduction lens. In order to achieve finer resolution of the mask image on the wafer, this reflective member captures diffracted light diffracting beyond the reduction lens and redirects the diffracted light to pass through the reduction lens such that the diffracted light is redirected onto the wafer. In so doing, the reflective member resolves the mask image on the wafer in more detail than is possible by an optical lithography process using no such reflective member.

In another embodiment of the present invention, an optical lithography system has in place a mask, a wafer and a reduction lens disposed between the mask and the wafer. In addition, the system has a reflective member comprised of two reflective surfaces, wherein the first reflective surface is disposed lower than the mask and higher than the reduction lens, and wherein the second reflective surface is disposed lower the reduction lens and higher than the wafer. The first reflective surface captures diffracted light diffracting beyond the reduction lens and redirects the diffracted light to pass through the reduction lens to reach the second reflective surface. The second reflective surface captures the diffracted light emerging from the reduction lens and redirects the emerging diffracted light onto the wafer to resolve the mask image. Furthermore, the orientation of each reflective surface can be adjusted according to specific image geometry of the mask. Consequently, in comparison to an optical lithography system having no such reflective member, this embodiment of the present invention resolves the image geometry of the mask in finer details.

In yet another embodiment of the present invention, in addition to a mask, a wafer and a reduction lens placed between the mask and the wafer, a reflective member is disposed proximate to the reduction lens. Furthermore, this reflective member comprises two reflective surfaces, wherein each reflective surface is formed by a series of mirrors. The first reflective surface formed by a first series of mirrors is placed lower than the mask and higher than the reduction lens. This first series of mirrors is calibrated to capture diffracted light from the mask and redirect the diffracted light to pass through the reduction lens. The second reflective surface formed by a second series of mirrors is placed lower than the reduction lens and higher than the wafer. This second series of mirrors is calibrated to capture the diffracted light emerging from the reduction lens and redirect the diffracted light toward the wafer. By capturing the information contained in the diffracted light not going through the reduction lens and using this information to resolve the mask image on the wafer, this embodiment of the present invention achieves a resolution of the mask image on the wafer not possible with an optical lithography apparatus having no such reflective member.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one skilled in the art that the present invention may be practiced without these specific details. In other instances, well known methods, procedures, components, and circuits have not been described in detail as to avoid unnecessarily obscuring aspects of the present invention.

Figure 1A:
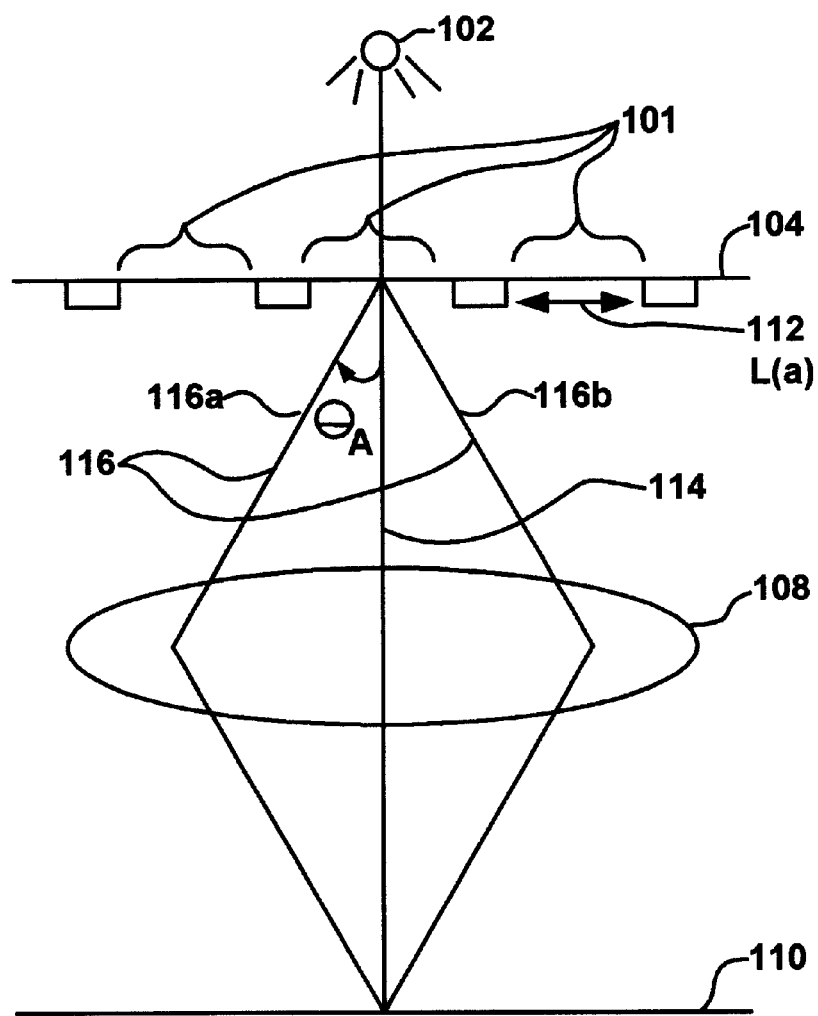
FIG. 1A is a cross sectional view of a standard optical lithography system.

FIG. 1A is a cross section of a standard optical lithography system 100. Optical lithography system 100 includes a mask 104, a wafer 110, and a reduction lens 108 positioned between the mask 104 and the wafer 110. Light coming from the light source 102 passes through mask features 101 of mask 104. Mask features 101 of the embodiment of FIG. 1A have a linear dimension L(a) 112. Mask features 101 cause the light to diffract away from mask features 101 at the diffraction angle of $\Theta_A$. Vertical line 114 indicates the 0th order diffracted light, wherein "0th order" means no diffraction. Lines 116a and 116b together indicate 1st order diffracted light 116. Each of these two lines 116a and 116b makes an angle of diffraction angle $\Theta_A$ with 0th order diffracted light 114. As shown in FIG. 1A, 0th order diffracted light 114 and 1st order diffracted light 116 are both captured by reduction lens 108. Then, reduction lens 108 redirects 1st order diffracted light 116 to combine with 0th order diffracted light 114 for resolving mask features 101 onto wafer 110. Importantly, in other embodiments of the present invention not illustrated here, different alternative arrangements of multiple lenses are sometimes used in place of reduction lens 108.

Figure 1B:
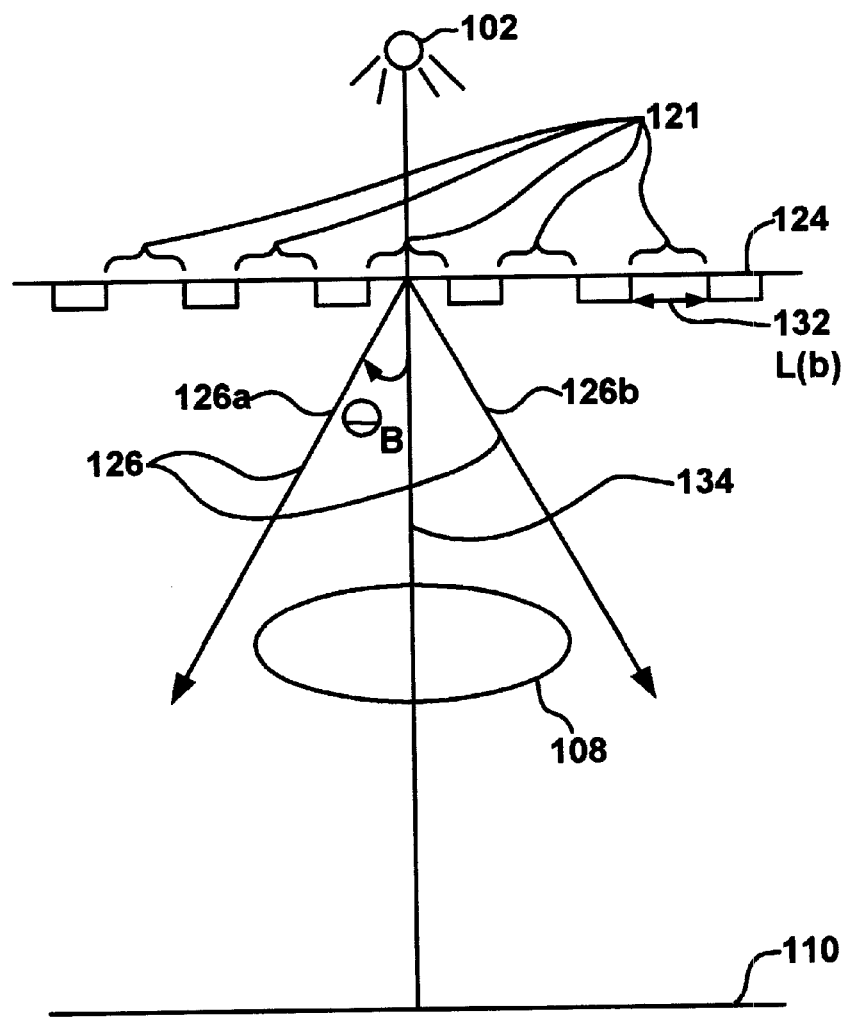
FIG. 1B is a cross sectional view of a standard optical lithography system as having a mask with small features.

In FIG. 1B, a cross section of the same optical lithography system is illustrated once again, except for the replacement of mask 104, with a new mask 124. New mask 124 has smaller feature dimension L(b) 132 than that of original mask 101 (i.e., feature dimension L(a) 112). As mask feature dimension decreases, light diffraction increases. Consequently, diffraction angle $\Theta_B$ of FIG. 1B is larger than diffraction angle $\Theta_A$ of FIG. 1A. Lines 126a and 126b represent 1st order diffracted light 126 diffracting from new mask 124. Lines 126a and 126b are shown to be diffracting beyond reduction lens 108 and missing wafer 110 entirely. Only 0th order diffracted light 134 arrives at wafer 110.

1st order diffracted light 126 contains important information about the geometry of mask features 121. This information allows the mask image to have sharp and clear edges on wafer 110. Without 1st order diffracted light 126 arriving on wafer 110 in combination with 0th order diffracted light 134, the mask image on wafer 110 loses clarity that is vital for exposing a high contrast and usable image on wafer 110. As such, if mask feature dimension decreases (as in the case of new mask 124), optical lithography system 190 illustrated in FIG. 1B can no longer expose usable images onto wafer 110. In other words, the standard optical lithography system is approaching its limitation. Thus, as the diffraction angle increases from $\Theta_A$ to $\Theta_B$ due to finer mask features 121, a need exists for retaining the information lost through light diffraction in order to utilize the information contained in diffracted light 126 necessary for resolving the mask feature image onto wafer 110.

Figure 2A:
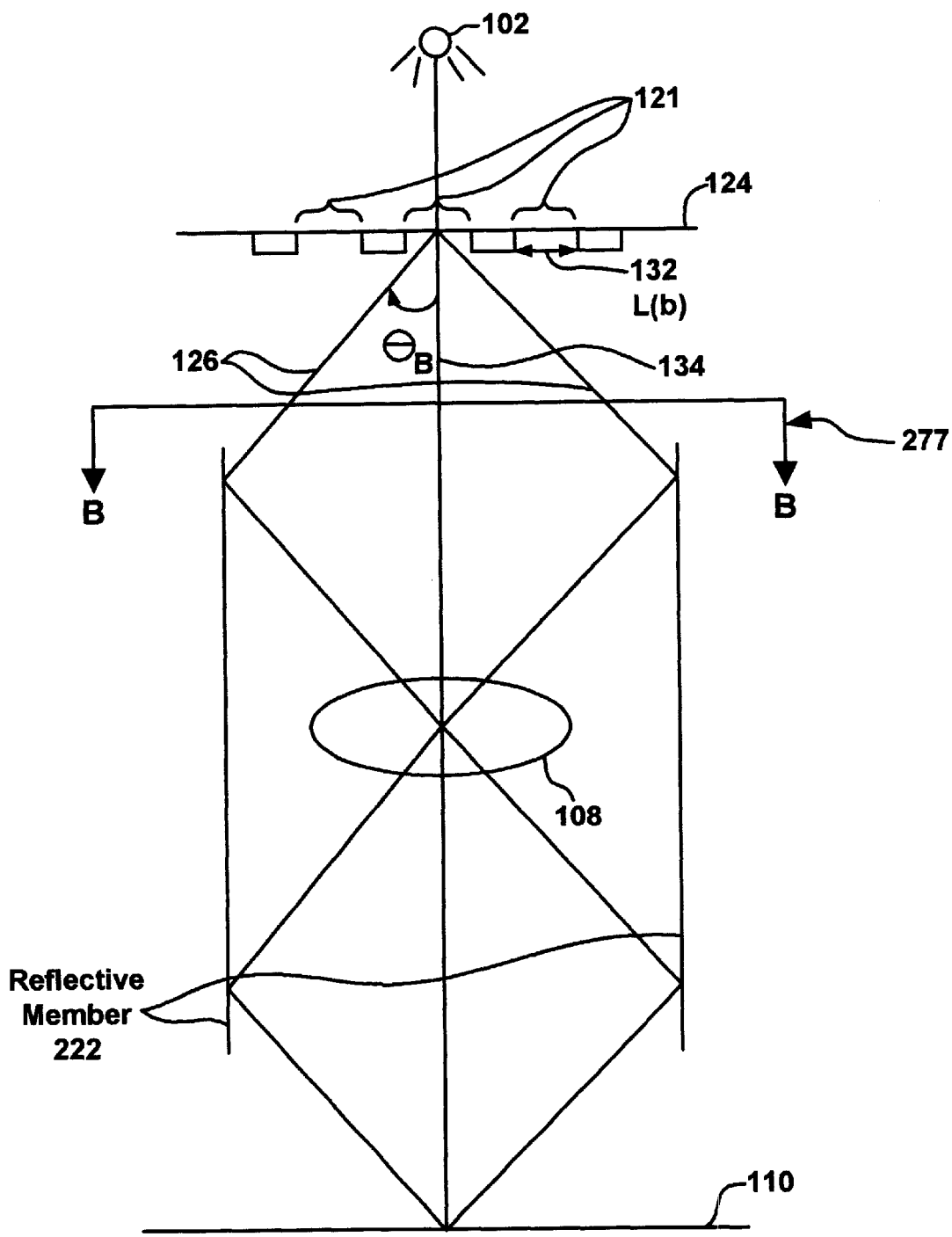
FIG. 2A is a cross sectional view of a lithography system having a reflective member in accordance with one embodiment of the present invention.

FIG. 2A is a cross section of a system 200 in accordance with one embodiment of the present invention that solves the problem of losing mask image information through light diffraction. This embodiment of the present invention includes a reflective member 222 adapted to be coupled to reduction lens 108 for enhancing the resolution of a mask's image on wafer 110. Reflective member 222 captures diffracted light 126 diffracting beyond reduction lens 108 with diffraction angle $\Theta_B$, then redirects diffracted light 126 to pass through reduction lens 108 such that diffracted light 126 is redirected onto wafer 110. In doing so, reflective member 222 recovers the information lost due to diffraction, thereby exposing the mask image faithfully onto wafer 110. Furthermore, this particular embodiment of the present invention advantageously avoids prior art approaches employing an enlarged reduction lens, an expensive phase shifted mask, and off-axis illumination.

Figure 2B:
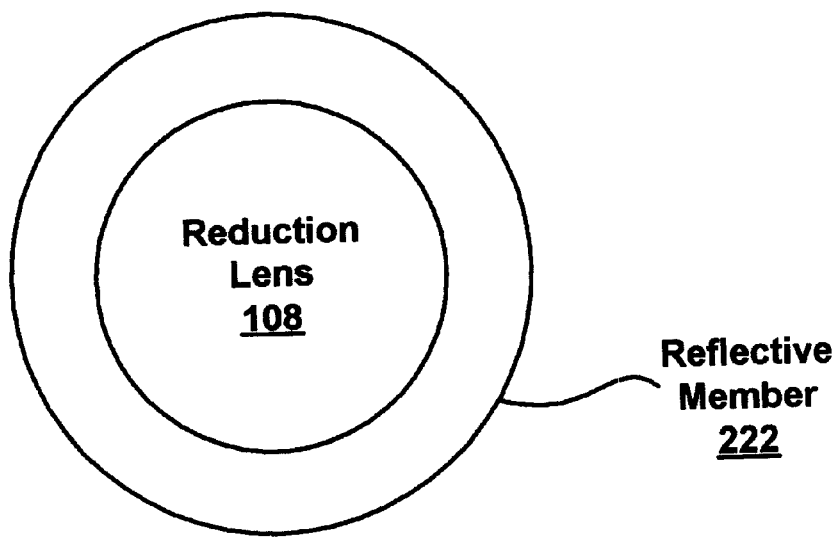
FIG. 2B is a top view of a portion of the embodiment of FIG. 2A.

FIG. 2B is a top view of system 200 taken through line B—B 277 of FIG. 2A. Viewed this way, as shown in FIG. 2B, reduction lens 108 appears circular. Furthermore, reflective member 222 appears to be a circular ring peripherally surrounding reduction lens 108.

Importantly, the configuration of reflective member 222 is not limited to this illustrated circular configuration circumscribing reduction lens 108. In one embodiment, reflective member 222 has a non-circular configuration when viewed from the top of optical lithography system 200. In addition, in contrast to the above illustrated reflective member 222 which completely surrounds reduction lens 108, reflective member 222 can also have various other configurations which only partially surround reduction lens 108. Furthermore, the coupling of reflective member 222 is not limited to the simple optical coupling of the present embodiment. In one embodiment, reflective member 222 couples to reduction lens 108. In yet another embodiment, reflective member 222 couples to other physical components of a optical lithography system.

Figure 3A:
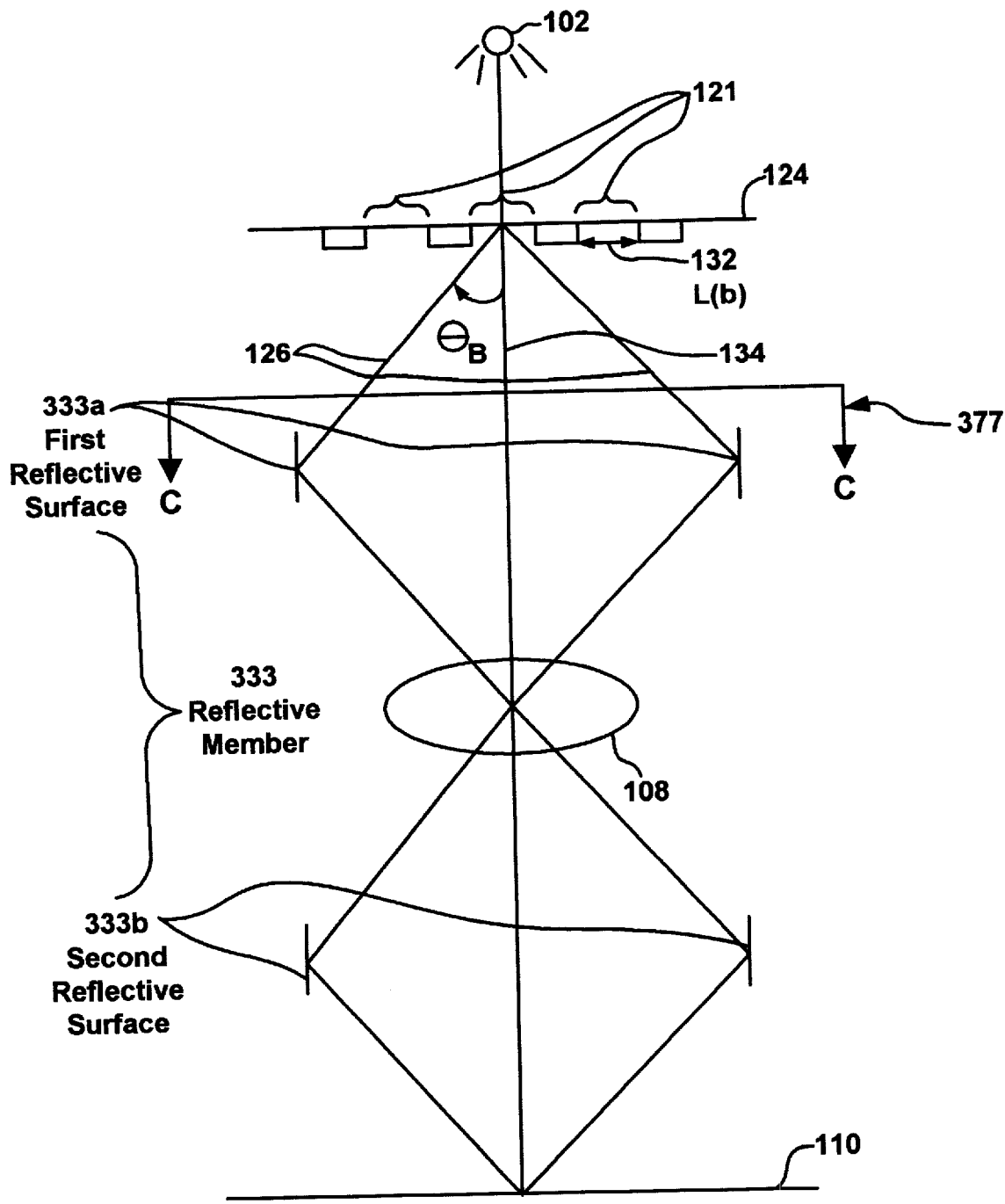
FIG. 3A is a cross sectional view of a lithography system having a reflective member which comprises of two reflective surfaces in accordance with another embodiment of the present invention.

With reference now to FIG. 3A, a cross section of another system 300 is illustrated in accordance with still another embodiment of the present invention. The embodiment of FIG. 3A includes a reflective member 333 which comprises of two separate reflective surfaces 333*a* and 333*b*. The first reflective surface 333*a* is disposed lower than mask 124 and higher than reduction lens 108. The second reflective surface 333*b* is disposed lower than reduction lens 108 and higher than wafer 110. The first reflective surface 333*a* captures diffracted light 126 from mask 124 and redirects diffracted light 126 to pass through reduction lens 108. Importantly, diffracted light 126 captured by reflective surfaces 333*a* and 333*b* must contain at least up to 1st order light diffraction 126. As redirected light emerges from reduction lens 108, second reflective surface 333*a* captures emerging diffracted light 126 and redirects diffracted light 126 toward wafer 110. In doing so, the information which would have been lost (i.e., through diffracted light 126) is recovered by reflective surfaces 333*a* and 333*b* comprising reflective member 333 of this particular embodiment. Once again, this embodiment of the present invention advantageously avoids methods employing an enlarged reduction lens, an expensive phase shifted mask, and off-axis illumination, as are found in prior art approaches.

Figure 3B:
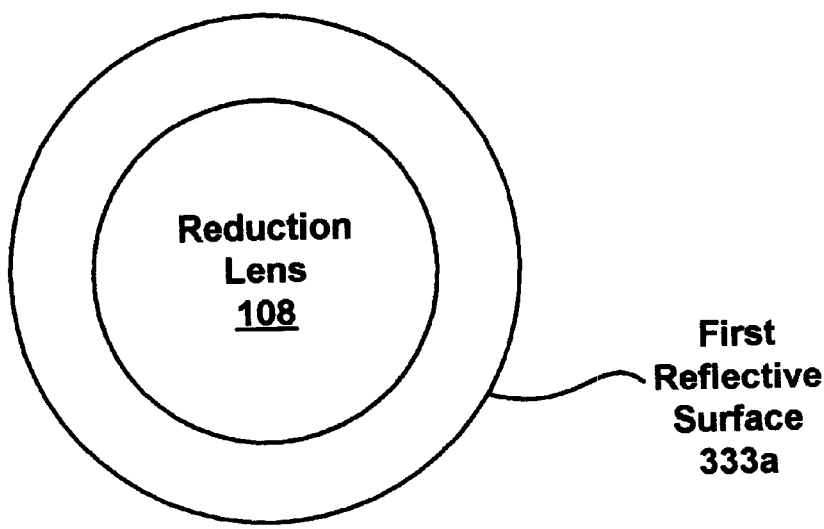
FIG. 3B is a top view of a portion of the embodiment of FIG. 3A.

FIG. 3B is a top view of system 300 taken through line C—C 377 of FIG. 3A. As shown in FIG. 3B, first reflective surface 333*a* forms a circular configuration peripherally surrounding reduction lens 108.

Importantly, the possible arrangements and variations of reflective surfaces 333*a* and 333*b* are not limited by the configuration illustrated in FIG. 3B. These various configurations make possible pattern enhancements for features of specific orientation. Neither reflective surfaces 333*a* and 333*b* has to form a circular configuration around reduction lens 108. Viewed from the top of optical lithography system 300, each reflective surface (333*a* or 333*b*) can have non-circular configuration tailored for improving the resolution of the mask image on wafer 110. In addition, the present invention is also well suited to an embodiment in which none of reflective surfaces 333*a* and 333*b* completely surrounds the reduction lens 108. That is, in one embodiment, alternative reflective surfaces which only partially surround reduction lens 108 are used. Furthermore, in the present embodiment, the coupling of reflective surfaces 333*a* and 333*b* is not limited to the simple optical coupling of the present embodiment. In another embodiment, reflective surfaces 333*a* and 333*b* couple to reduction lens 108. In yet another embodiment, reflective surfaces 333*a* and 333*b* couple to other physical components of a optical lithography system.

Figure 4A:
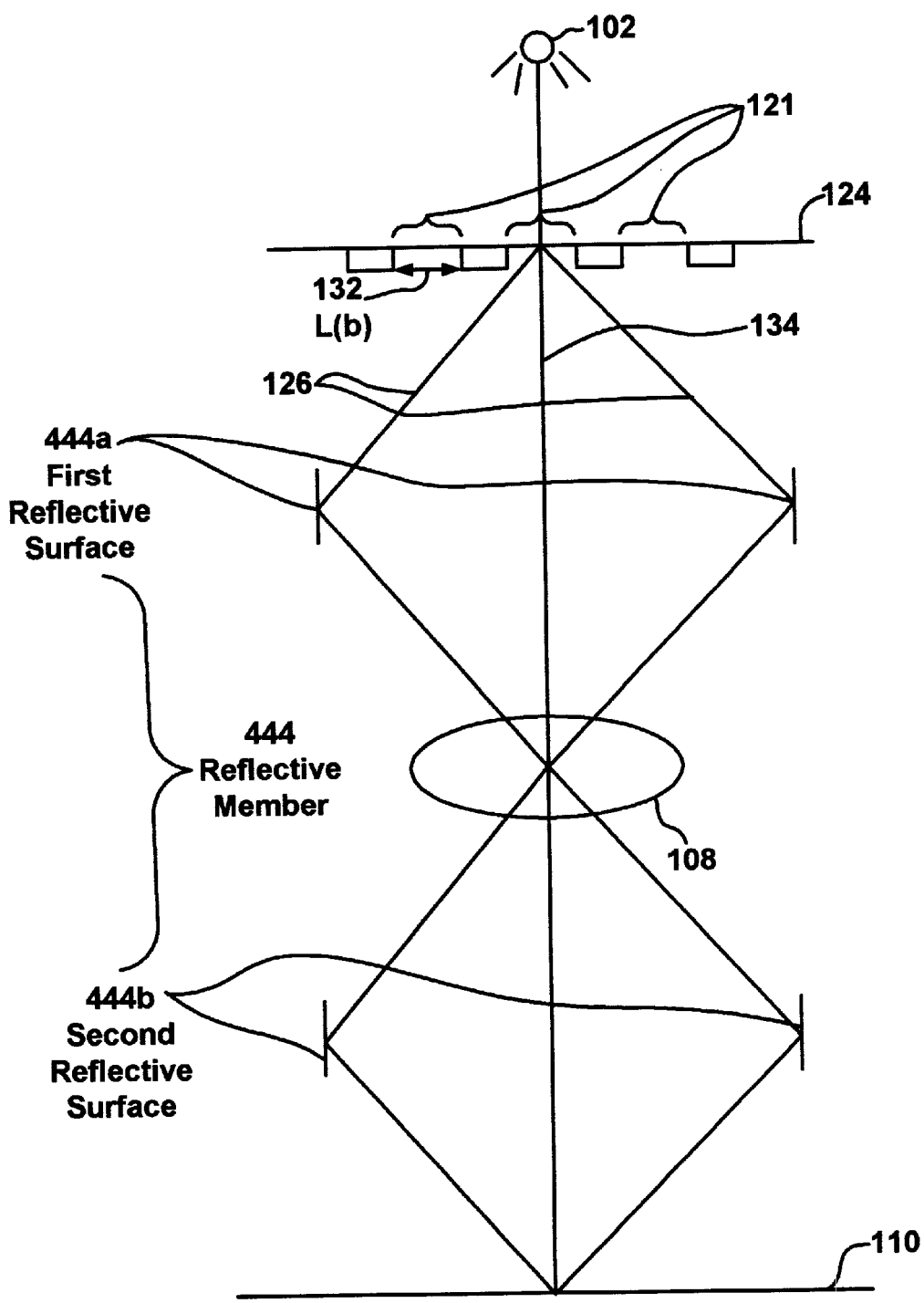
FIG. 4A is a cross sectional view of a lithography system having a reflective member which comprises of two reflective surfaces, wherein each of these two surfaces is formed by a series of mirrors in accordance with a third embodiment of the present invention.

FIG. 4A is a cross section of yet another embodiment of the present invention. Similar to embodiments of FIGS. 3A and 3B, the present embodiment includes a reflective member 444 which is comprised of two separate reflective surfaces 444*a* and 444*b*. The first reflective member 444*a* is disposed lower than mask 124 and higher than reduction lens 108 while the second reflective member 444*b* is disposed lower than reduction lens 108 and higher than wafer 110.

Figure 4B:
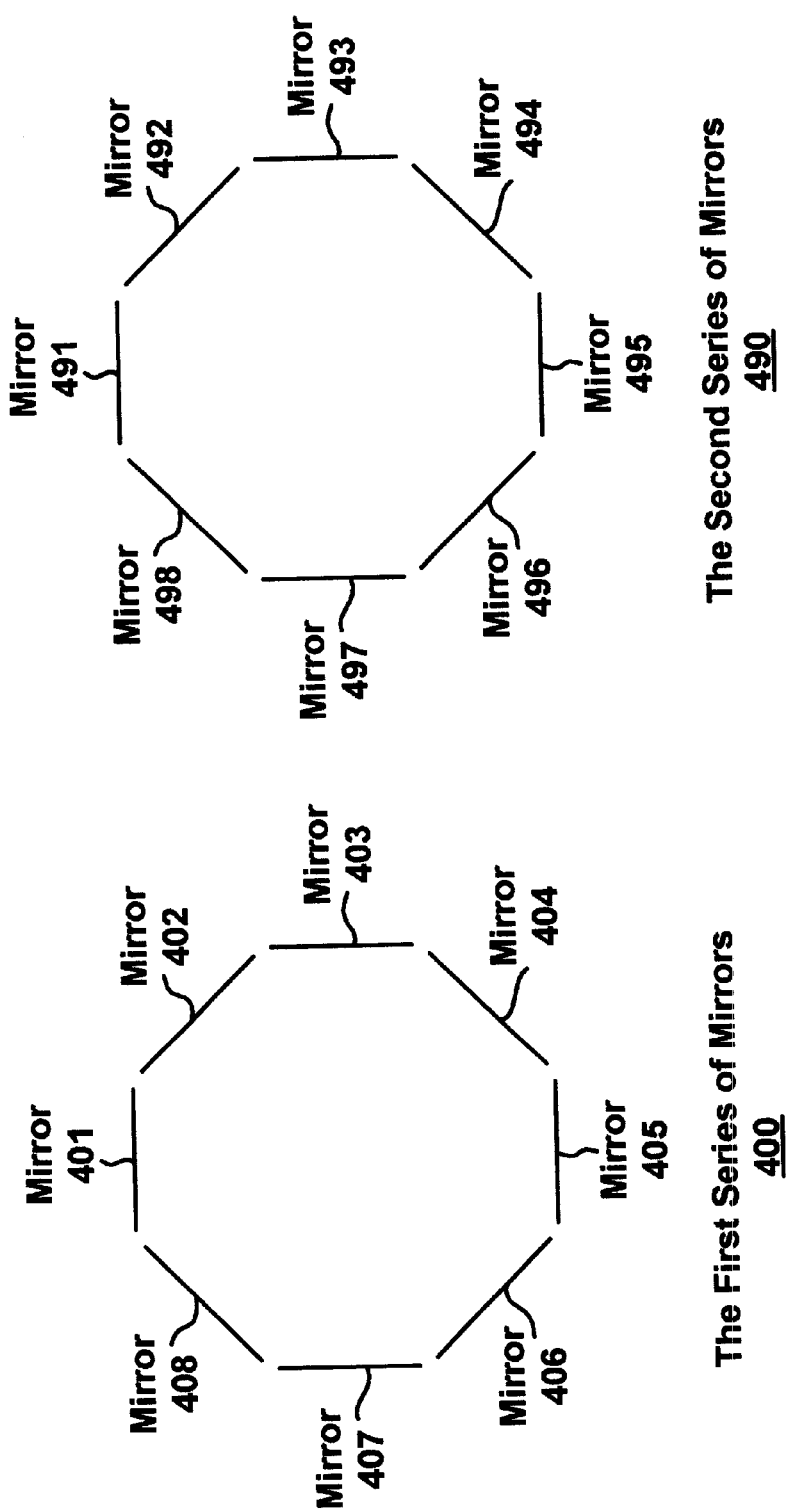
FIG. 4B is a top view of a portion of the embodiment of FIG. 4A.

With reference now to FIG. 4B, a top view of reflective surfaces 444*a* and 444*b* is shown. As shown in FIG. 4B, first reflective surface 444*a* by itself is comprised of a first series of mirrors 400 typically shown as mirrors 401–408. Similarly, second reflective surface 444*b* is comprised of a second series of mirrors 490, typically shown as mirrors 491–498.

In the embodiment of FIG. 4A, first series of mirrors 400 has an orientation calibrated to redirect light 126 diffracting from mask 124 to pass through reduction lens 108 and reach second series of mirrors 490. Second series of mirrors 490 has an orientation calibrated to redirect diffracted light 126 emerging from reduction lens 108 onto wafer 110 in order to expose mask's image onto wafer 110. In doing so, information which would have been lost in diffracted light 126 is recovered by reflective surfaces 444*a* and 444*b*. As with the previously discussed embodiments, this particular embodiment of the present invention advantageously avoids conventional methods including use of an enlarged reduction lens, an expensive phase shifted mask, and off-axis illumination.

Additionally, the present invention is also well suited to having any of numerous variations not illustrated in FIGS. 4A and 4B. For example, both reflective surfaces 444*a* and 444*b* do not have to be formed by series of mirrors at the same time. In one such embodiment, first reflective surface 444*a* is formed by a series of mirrors while second reflective surface 444*b* exists as one piece. Conversely, first reflective surface 444*a* exists as one piece while second reflective surface 444*b* is formed by a series of mirrors. In addition, in the present embodiment, the number of mirrors used in forming each reflective surface (444*a* or 444*b*) is well suited to being adjusted according to the geometry of mask features 121. Furthermore, in the present embodiment, the coupling of reflective surfaces 444*a* and 444*b* is not limited to the simple optical coupling of the present embodiment. In another embodiment, reflective surfaces 444*a* and 444*b* couple to reduction lens 108. In yet another embodiment, reflective surfaces 444*a* and 444*b* couple to other physical components of a optical lithography system.

Figure 5:
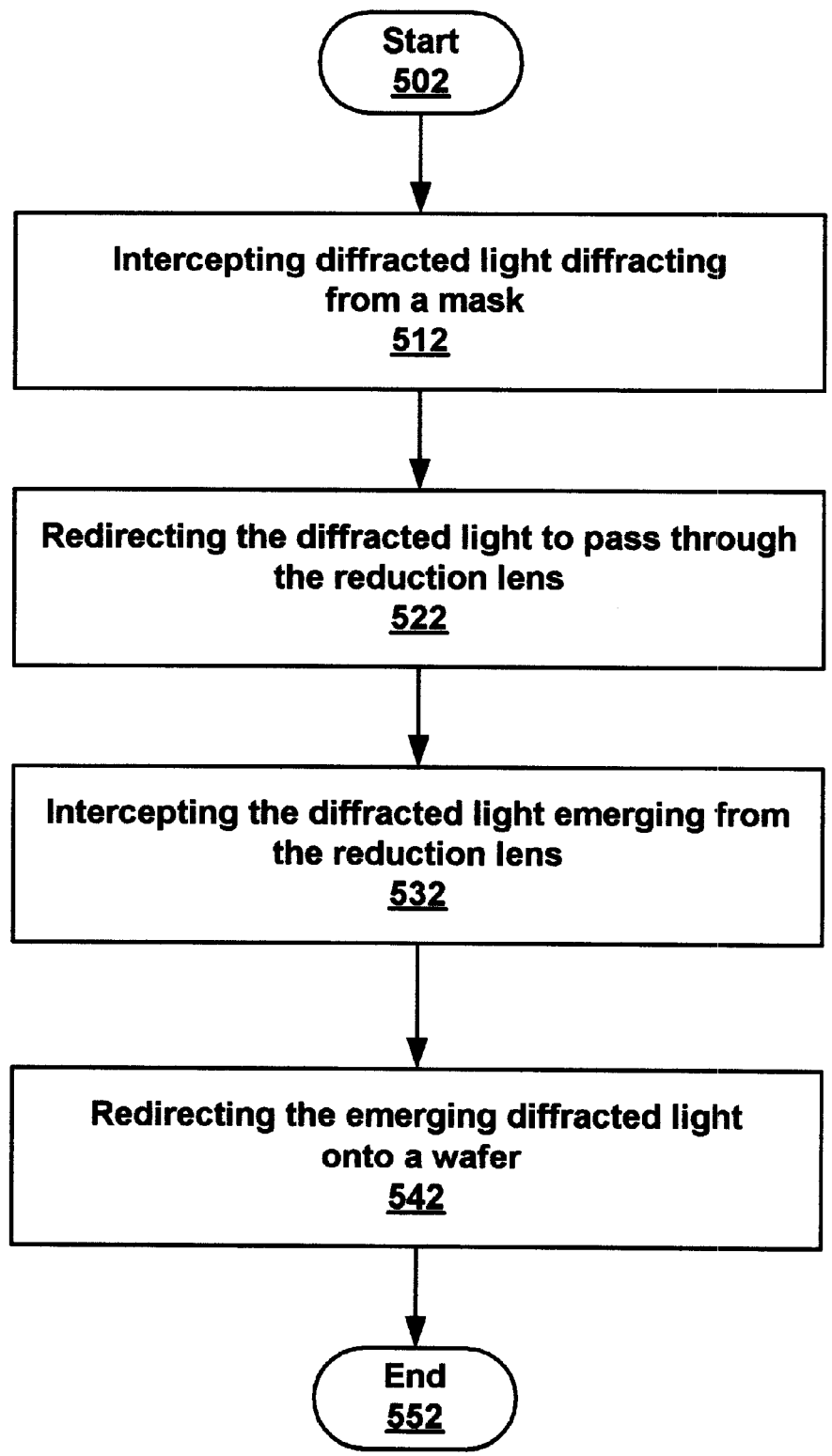
FIG. 5 shows a flow chart outlining the steps comprising the method of the present invention.

With reference now to FIG. 5, a flow chart is shown outlining the steps of the present invention. In particular, this flow chart teaches a method of capturing diffracted light diffracting beyond a reduction lens in order to enhance the resolution of a mask's image on a wafer. First, in step 512 light diffracting from the mask is intercepted. Importantly, the intercepted diffracted light must contain at least up to the 1st order diffracted light. Generally, the 1st order diffracted light contains geometry information for resolving the edges of the mask image on the wafer. Thus, by intercepting the diffracted light at least up to the 1st order, this geometry information is prevented from being lost in the diffracted light.

However, just preventing information loss in diffracted light is not enough for the purpose of resolving a crisp and clear mask image on the wafer. In general, the size of the mask image needs to undergo reduction in order to fit inside the area of the wafer. Thus, in step 522 the intercepted diffracted light is redirected toward a reduction lens. Specifically, the diffracted light is redirected to pass through the reduction lens. In doing so, the mask image information provided by the diffracted light also undergoes the necessary reduction.

Furthermore, if the 1st order diffracted light emerging from the reduction lens were not intercepted, the 1st order diffracted light would miss the wafer, thereby losing the information necessary for successfully resolving the mask image on the wafer. Thus, in step 532 the diffracted light entering the reduction lens and emerging from the reduction lens is intercepted again. In doing so, the necessary mask image information is prevented from being lost in diffraction.

Finally, after the diffracted light is twice prevented from being lost in diffraction, in step 542 the twice intercepted diffracted light (up to at least the 1st order) is redirected to combine with the 0th order diffracted light (i.e., undiffracted light that directly goes through the reduction lens to arrive at the wafer). In doing so, the mask image is exposed onto the wafer with crisp and clear edges.

Figure 6:
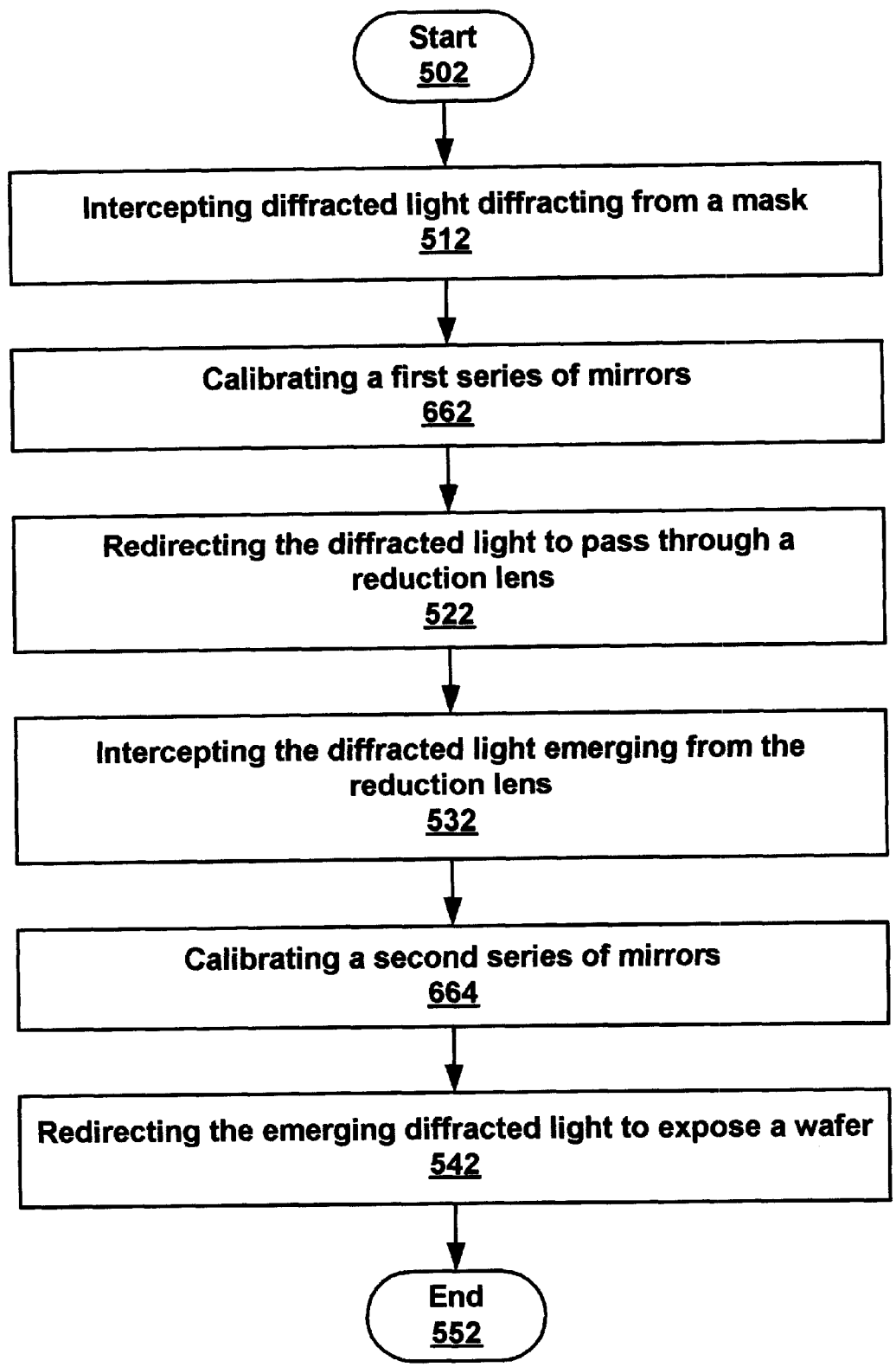
FIG. 6 show a flow chart outlining the variation of the steps comprising the method of the present invention.

FIG. 6 shows another flow chart outlining a variation on the steps of the present invention. First, in step 512 light diffracting from the mask is intercepted. Importantly, the intercepted diffracted light must contain at least up to the 1st order diffracted light. Generally, the 1st order diffracted light contains geometry information for resolving the edges of mask image on the wafer. Thus, by intercepting the diffracted light at least up to the 1st order, this geometry information is prevented from being lost in the diffracted light.

However, just preventing information loss in diffracted light is not enough for the purpose of resolving a crisp and clear mask image on the wafer. The size of the mask image in general needs to undergo reduction in order to fit inside the area of the wafer. Thus, in step 662 a series of mirrors is calibrated to redirect the diffracted light to pass through the reduction lens.

After the calibration mirrors is done, in step 522 the intercepted diffracted light is redirected toward the reduction lens. Specifically, the diffracted light is redirected by the calibrated mirrors to pass through the reduction lens. In doing so, the mask image information provided by the diffracted light also undergoes the necessary reduction.

In step 532 as the diffracted light emerges from the reduction lens, the diffracted light is intercepted at first by the second series of mirrors. If the 1st order diffracted light emerging from the reduction lens were not intercepted, the 1st order diffracted light would miss the wafer, thereby losing the information necessary for successfully resolving the mask image.

After the diffracted light is twice prevented from being lost in diffraction, in step 664 the second series of mirrors is calibrated so that the twice intercepted diffracted light (up to at least the 1st order) is redirected to combine with the 0th order diffracted. These mirrors are calibrated to have various orientations adapted to enhance resolution of various mask images.

Finally in step 542, after the second series of mirrors are calibrated, the emerging diffracted light is redirected to expose the wafer. In doing so, the mask image is exposed onto the wafer with crisp and clear edges.

Hence, the present invention advantageously avoids a prior art approach employing a physically unfeasible enlarged lens to capture diffracted light from the mask. Also, the present invention advantageously avoids another prior art approach employing a very expensive phase shifted mask to reduce the information loss in the diffracted light. Furthermore, the present invention advantageously avoids yet another prior art approach employing complicated off-axis illumination technique in reducing the diffracted light traveling beyond the reduction lens.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, and to thereby enable others skilled in the art best to utilize the invention and various embodiments with various modifications as are suited to the particular use contemplated. It is intended that the scope of the invention be defined by the claims appended hereto and their equivalents.

What is claimed is:

1. An apparatus for enhancing the resolution of a mask's image on a semiconductor wafer, said apparatus comprising:
   a reflective member for coupling to a reduction lens, said reflective member capturing diffracted light diffracting beyond said reduction lens and redirecting said diffracted light to pass through said reduction lens;
   said reflective member also capturing diffracted light emerging from said reduction lens such that said diffracted light is redirected onto said wafer.

2. The apparatus of claim 1, wherein said diffracted light comprises at least first order diffracted light.

3. The apparatus of claim 1, wherein said reflective member comprises:
   a first series of mirrors capturing said diffracted light from said mask and redirecting said diffracted light to pass through said reduction lens; and
   a second series of mirrors capturing said diffracted light emerging from said reduction lens and redirecting said diffracted light toward said wafer.

4. The apparatus of claim 3, wherein said first series of mirrors form a first reflective surface, wherein said first reflective surface is disposed lower than said mask and higher than said reduction lens.

5. The apparatus of claim 4, wherein at least one of said first series of mirrors has orientation calibrated to redirect said diffracted light to pass through said reduction lens and reach said second reflective surface.

6. The apparatus of claim 3, wherein said second series of mirrors form a second reflective surface, wherein said second reflective surface is disposed lower than said reduction lens and higher than said wafer.

7. The apparatus of claim 6, wherein at least one of said second series of mirrors has orientation calibrated to redirect said diffracted light emerging from said reduction lens on said wafer for exposing said mask's image onto said wafer.

8. In an optical lithography system, a method for capturing diffracted light diffracting beyond a reduction lens in order to enhance the resolution of a mask's image on a wafer, said method comprising the steps of:
   a) intercepting diffracted light diffracting from a mask;
   b) redirecting said diffracted light to pass through a reduction lens;
   c) intercepting said diffracted light emerging from said reduction lens; and
   d) redirecting said emerging diffracted light to expose a wafer.

9. The apparatus of claim 8, wherein said diffracted light comprises at least first order diffracted light.

10. The method of claim 8, wherein said step b) further comprises:
   calibrating a first series of mirrors to redirect said diffracted light to pass through said reduction lens.

11. The method of claim 8, wherein said step d) further comprises:
   calibrating a second series of mirrors to redirect said diffracted light emerging from said reduction lens, wherein said diffracted light exposes said wafer.

12. In enhancing an optical lithography process, a system for capturing light diffracted from a mask having features to be exposed onto a wafer, said system comprising:
   a mask;
   a wafer;
   a reduction lens disposed between said mask and said wafer; and
   a reflective member, said reflective member disposed proximate to said reduction lens, wherein said reflective member captures diffracted light diffracting beyond said reduction lens and redirects said diffracted light to pass through said reduction lens;
   said reflective member also capturing diffracted light emerging from said reduction lens such that said diffracted light is redirected onto said wafer.

13. The system of claim 12, wherein said diffracted light comprises at least first order diffracted light.

14. The system of claim 12, wherein said reflective member comprises:
   a first reflective surface disposed lower than said mask and higher than said reduction lens; and
   a second reflective surface disposed lower than said reduction lens and higher than said wafer.

15. The system of claim 14 wherein said first reflective surface captures said diffracted light diffracting beyond said reduction lens and redirects said diffracted light to pass through said reduction lens to reach said second reflective surface.

16. The system of claim 14 wherein said second reflective surface captures said diffracted light emerging from said reduction lens and redirects said emerging diffracted light onto said wafer.

17. The system of claim 15, wherein said first reflective surface has orientation coordinatized by a first plurality of orientation parameters to specify said orientation.

18. The system of claim 17, wherein said orientation is calibrated for resolving image geometry of said mask by adjusting said plurality of orientation parameters.

19. The system of claim 16, wherein said second reflective surface has orientation coordinatized by a second plurality of orientation parameters to specify said orientation.

20. The system of claim 19, wherein said orientation is calibrated for resolving image geometry of said mask by adjusting said plurality of orientation parameters.

* * * * *